United States Patent
Kumagai et al.

(10) Patent No.: US 11,643,748 B2
(45) Date of Patent: May 9, 2023

(54) SILICON CARBIDE SINGLE CRYSTAL

(71) Applicant: CENTRAL GLASS CO., LTD., Yamaguchi (JP)

(72) Inventors: Kazuto Kumagai, Ube (JP); Tomonori Umezaki, Ube (JP)

(73) Assignee: CENTRAL GLASS CO., LTD., Yamaguchi (JP)

( * ) Notice: Subject to any disclaimer, the term of this patent is extended or adjusted under 35 U.S.C. 154(b) by 251 days.

(21) Appl. No.: 16/758,572

(22) PCT Filed: Nov. 1, 2018

(86) PCT No.: PCT/JP2018/040681
§ 371 (c)(1),
(2) Date: Apr. 23, 2020

(87) PCT Pub. No.: WO2019/088221
PCT Pub. Date: May 9, 2021

(65) Prior Publication Data
US 2020/0347511 A1    Nov. 5, 2020

(30) Foreign Application Priority Data
Nov. 1, 2017  (JP) ............................. JP2017-211680

(51) Int. Cl.
*C30B 15/36*   (2006.01)
*C30B 29/36*   (2006.01)
(Continued)

(52) U.S. Cl.
CPC .............. *C30B 15/36* (2013.01); *C30B 29/36* (2013.01); *H01L 29/167* (2013.01); *H01L 29/1608* (2013.01)

(58) Field of Classification Search
CPC ........................... H01L 21/208; H01L 29/167
See application file for complete search history.

(56) References Cited

U.S. PATENT DOCUMENTS 7,230,274 B2    6/2007  O'Loughlin et al.
9,070,567 B2    6/2015  Sasaki et al.
(Continued)

FOREIGN PATENT DOCUMENTS

CN        1926266       3/2007
JP      2010-192697     9/2010
(Continued)

OTHER PUBLICATIONS

Office Action dated Aug. 23, 2022 in corresponding Japanese Patent Application No. 2018-204131, with English translation.
(Continued)

*Primary Examiner* — Thao P Le
(74) *Attorney, Agent, or Firm* — Wenderoth, Lind & Ponack, L.L.P.

(57) ABSTRACT

A 4H-SiC single crystal having good morphology while preventing heterogeneous polymorphs from being mixed in regardless of the presence or absence of doping in growing a 4H-SiC single crystal by the TSSG method is obtained. When the off-angle on the grown crystal in a method for producing a SiC single crystal by a TSSG method is set to 60 to 68°, heterogeneous polymorphs are less likely to be mixed in during the growth of 4H-SiC single crystal, and if, during that period, a meltback method is used to smooth the surface of the seed crystal and then grow the crystal, it is possible to obtain a grown crystal having good morphology.

8 Claims, 3 Drawing Sheets

(51) Int. Cl.
*H01L 29/16* (2006.01)
*H01L 29/167* (2006.01)

(56) References Cited

U.S. PATENT DOCUMENTS

| | | | |
|---|---|---|---|
| 9,512,540 | B2 | 12/2016 | Kusunoki et al. |
| 9,903,046 | B2 | 2/2018 | O'Loughlin et al. |
| 2007/0108450 | A1 | 5/2007 | O'Loughlin et al. |
| 2008/0054412 | A1 | 3/2008 | O'Loughlin et al. |
| 2011/0210342 | A1 | 9/2011 | Sasaki et al. |
| 2013/0042802 | A1 | 2/2013 | Danno et al. |
| 2013/0220212 | A1 | 8/2013 | Kusunoki et al. |
| 2022/0208794 | A1* | 6/2022 | Kunitake ............ H01L 29/7869 |
| 2022/0223671 | A1* | 7/2022 | Yamazaki ........... H01L 27/3248 |
| 2022/0238718 | A1* | 7/2022 | Kanagawa .............. H01L 27/06 |
| 2022/0246763 | A1* | 8/2022 | Yamazaki ......... H01L 27/10805 |
| 2022/0251725 | A1* | 8/2022 | Kuo .................... C23C 14/0635 |
| 2022/0271168 | A1* | 8/2022 | Yamazaki ............. H01L 29/792 |

FOREIGN PATENT DOCUMENTS

| | | |
|---|---|---|
| JP | 2012-101960 | 5/2012 |
| JP | 2016-166101 | 9/2016 |
| JP | 2016-172674 | 9/2016 |
| TW | 201036053 | 10/2010 |
| WO | 2011/007458 | 1/2011 |

OTHER PUBLICATIONS

International Search Report dated Dec. 11, 2018 in International (PCT) Application No. PCT/JP2018/040681.
Mitani et al., "Morphological stability of 4H-SiC crystals in solution growth on {0001} and {110m} surfaces," Journal of Crystal Growth, Jun. 2017, vol. 468, pp. 883-888.
Mitani et al., "4H-SiC Growth from Si—Cr—C Solution under Al and N Co-doping Conditions," Materials Science Forum, Jun. 2015, vols. 821-823, pp. 9-13.
Extended European Search Report dated Jun. 8, 2021 in corresponding European Application No. 18871998.3.
Notice of Reasons for Refusal dated Jan. 5, 2023 in corresponding Japanese Patent Application No. 2018-204131, with English language translation.

* cited by examiner

SILICON CARBIDE SINGLE CRYSTAL

TECHNICAL FIELD

The present invention relates to a method for producing a high quality silicon carbide single crystal, which is suitable as a material for a wide gap semiconductor device, by a liquid phase growth method.

BACKGROUND ART

Silicon carbide (SiC) has a larger band gap and dielectric breakdown voltage than those of silicon (Si), which is widely used as a material for electronic devices, and is expected as a substrate material of a power device exceeding a device using a Si substrate. The SiC substrate is obtained by being cut out from a SiC single crystal ingot. Known methods for producing a SiC ingot include a method for growing a SiC crystal in a gas phase (vapor phase growth method) and a method for growing a SiC crystal in a liquid phase (liquid phase growth method). The liquid phase growth method performs crystal growth in a state closer to thermal equilibrium than the vapor phase growth method, and thus is expected to obtain a high quality SiC single crystal having a small defect density.

For the purpose of spreading SiC as a substrate material for power devices, it is essential to improve the quality of a SiC single crystal as a device material in order to improve device reliability. In the production of a SiC crystal by the liquid phase growth method, it is required to obtain a SiC single crystal having a smooth surface without a trench.

As the liquid phase growth method, a TSSG (Top Seeded Solution Growth) method has been reported, in which a seed crystal is bonded to a holding shaft with an adhesive, and is brought into contact from above with a solution containing carbon and silicon to grow a crystal on the lower surface of the seed crystal. The TSSG method makes it possible to increase the length and diameter of the crystal by raising the holding shaft, and is expected to suppress uneven growth in the growth surface by rotating the holding shaft.

In the TSSG method, it has been widely conducted that a seed crystal (also referred to as an on-substrate) cut out on the (000-1) surface (also called a (000-1) on-axis surface or just-surface) is brought into contact with a solution to grow a crystal on the (000-1) surface. Growing a crystal on an on-substrate has characteristics that trenches and surface roughness are less likely to be produced than in an off-substrate (a substrate whose front surface is inclined from the (000-1) surface, and the angle of inclination is called the off-angle), and a grown crystal having good morphology can be obtained.

Meanwhile, the crystal polymorphism of SiC is a phenomenon in which the atomic stacking mode can have many crystal structures different only in the axial direction despite stoichiometrically identical compositions, and as the crystal polymorphs of SiC, 3C type, 4H type, 6H type, 15R type, and the like are known. Here, C represents a cubic system, H represents a hexagonal system, R represents a rhombohedral structure, and the numbers each represent the number of regular tetrahedral structure layers included in one cycle in the stacking direction. The 4H—SiC represents a SiC crystal having a 4H type polymorph. A preferable substrate material for power devices is a substrate made of one crystal system, which has no crystal systems mixed therein.

In the case of growing a crystal on a 4H—SiC on-substrate, good morphology can be obtained as described above, but there is a problem that heterogeneous polymorphs other than 4H—SiC are easily generated.

Non Patent Literature 1 reports that, as a result of evaluating the morphology in the case of growing crystals on various surfaces of the 4H—SiC single crystal, the (-110-1) surface inclined at 75.1° from the (000-1) surface has the smoothest surface, and the (-110-2) surface inclined at 62° from the (000-1) surface also has a good surface in the long-term growth using an Al-added solution (Non Patent Literature 1).

Non Patent Literature 2 describes a crystal growth method using co-doping of aluminum and nitrogen. It is known that aluminum, when added to a raw material solution, is effective in stabilizing polymorphism and morphology of a grown crystal. Under the co-doping conditions, the conductivity type of the substrate can be changed by adjusting the amounts of aluminum and nitrogen to be added.

In addition, Patent Literature 1 discloses a method in which a 4H—SiC seed crystal having unknown surface orientation is melted back in a melt with unsaturated C, and then grown at a temperature equal to or higher than that during the melt back to dissolve and remove the defect generation layer, whereby a SiC single crystal with reduced defect density is grown.

CITATION LIST

Patent Literatures

Patent Literature 1: International Publication No. WO2011/007458

Non Patent Literatures

Non Patent Literature 1: Takeshi Mitani and 4 others, "Morphological stability of 4H—SiC crystals in solution growth on {0001} and {110m} surfaces," Journal of Crystal Growth, June 2017, Volume 468, p. 883-888

Non Patent Literature 2: Takeshi Mitani and 7 others, "4H—SiC Growth from Si—Cr—C Solution under Al and N Co-doping Conditions," Materials Science Forum, June 2015, Volumes 821-823, p. 9-13

SUMMARY OF INVENTION

Problems to be Solved by the Invention

However, a substrate obtained by co-doping tends to have a higher resistance value than a substrate obtained by mono-doping. In addition, when aluminum was not added at all in the (000-1) surface growth, it is impossible to prevent the generation of heterogeneous polymorphs and the deterioration of morphology due to trench formation.

Specifically, in controlling the conduction type by doping, two or more dopants are often used to stabilize polymorphism and morphology, and as a result, the electrical characteristics of the crystal are often deteriorated. For this reason, if the generation of heterogeneous polymorphs and the deterioration of morphology can be suppressed without relying on doping, it is conceivably possible to prevent a change and the like in the electrical characteristics of the crystal due to excessive amounts and types of doping.

The present invention is to solve the above-described problem, and aims to obtain a 4H—SiC single crystal having good morphology while preventing heterogeneous polymorphs from being mixed in regardless of the presence or absence of doping in growing a SiC single crystal by the TSSG method.

Means for Solution of the Problems

The present inventors have made earnest studies on the effects of the off-angle on the grown crystal in a method for producing a SiC single crystal by a TSSG method, and have found as a result that, when the off-angle is set to 60 to 68°, heterogeneous polymorphs are less likely to be mixed in during the growth of 4H—SiC single crystal, and if, during that period, a meltback method is used to smooth the surface of the seed crystal and then the crystal is grown, it is possible to obtain a grown crystal having good morphology. Thus, the present invention has been completed.

The invention of the present application is a method for producing a silicon carbide single crystal, comprising: a meltback step of allowing a raw material solution containing silicon and carbon and having an unsaturated carbon concentration to come into contact with a 4H type silicon carbide seed crystal and to dissolve part of the seed crystal; and a crystal growth step of allowing the seed crystal to grow a 4H type silicon carbide single crystal, wherein a growth surface of the seed crystal is a surface inclined at an angle of 60° or more and 68° or less in a <1-100> direction from one of a (0001) surface and a (000-1) surface.

Advantageous Effects of Invention

The present invention makes it possible to obtain a 4H—SiC single crystal having good morphology while preventing heterogeneous polymorphs from being mixed in regardless of the presence or absence of doping in growing a SiC single crystal by the TSSG method.

DESCRIPTION OF EMBODIMENTS

In the present specification, "−1" in the notation such as the (000-1) surface is written as "4" instead of originally adding a horizontal line on the number.

Embodiments of the present invention are described with reference to the drawings.

Figure 1:
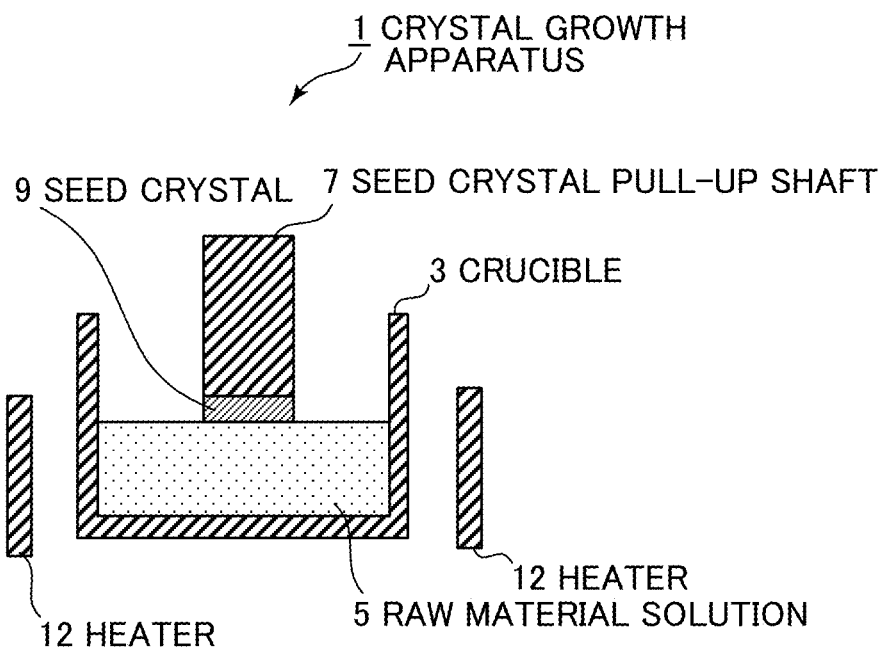
FIG. 1 is a diagram illustrating an overview of a crystal growth apparatus 1 according to the present invention.

FIG. 1 is a diagram illustrating an overview of a crystal growth apparatus 1 for implementing a method for producing a SiC single crystal of the present invention. The crystal growth apparatus 1 includes a raw material solution 5 containing silicon and carbon inside a crucible 3, and a seed crystal pull-up shaft 7 holds a seed crystal 9. The raw material solution 5 is heated by a heater 12 provided around the crucible 3.

Figure 2:
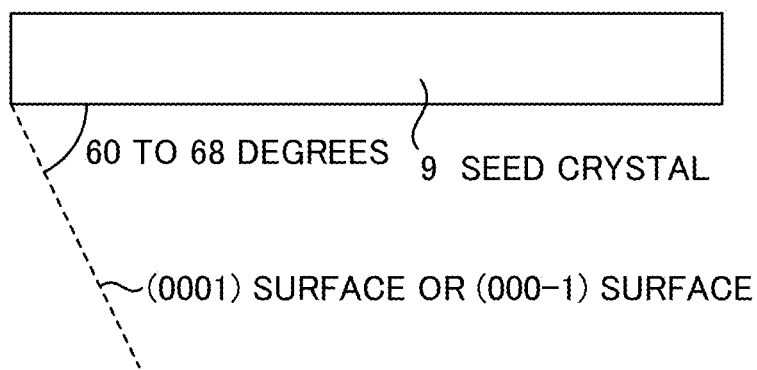
FIG. 2 is a schematic diagram of a cross section of a seed crystal 9 having an off-angle.

The lower surface of the seed crystal 9 is a growth surface which comes into contact with the raw material solution 5 and on which a silicon carbide single crystal grows. As illustrated in FIG. 2, the growth surface of the seed crystal 9 is a surface inclined at 60° or more and 68° or less in the <1-100> direction from one of the (0001) surface and the (000-1) surface.

The method for producing a silicon carbide single crystal of the present invention includes a meltback step of allowing a raw material solution 5 containing silicon and carbon and having an unsaturated carbon concentration to come into contact with a silicon carbide seed crystal 9 and to dissolve part of the seed crystal 9, and a crystal growth step of allowing the seed crystal 9 to grow a grown crystal of a silicon carbide single crystal.

In the meltback step, the seed crystal 9 is dissolved because the carbon concentration of the raw material solution 5 is not saturated. In the melt-back step, the unevenness on the surface of the seed crystal 9 is eliminated, and the lower surface of the seed crystal 9 is smoothed. Note that, in order to prevent the dissolution of the entire seed crystal 9 in the meltback step, the time for immersing the seed crystal 9 is adjusted to the time for dissolving only part of the seed crystal 9 in consideration of the dissolution rate.

After that, in the crystal growth step, the raw material solution 5 is supersaturated in the vicinity of the seed crystal 9 to grow a silicon carbide single crystal on the seed crystal 9.

The method for performing the meltback step is not particularly limited. However, when the crucible 3 is made of graphite and carbon is supplied from the crucible 3 to the raw material solution 5, a method is conceivable of bringing the seed crystal into contact with the raw material solution 5 at the temperature T1 in the course of raising the temperature. The dissolution of carbon from the crucible is slow and the concentration of carbon in the raw material solution is constantly in an unsaturated state in the course of raising the temperature. Therefore, when the seed crystal is brought into contact, SiC is dissolved from the seed crystal at the same time as carbon is dissolved from the crucible. After that, when the temperature is raised from the temperature T1 to the temperature T2 and held for a certain period of time to stabilize, carbon is sufficiently dissolved from the crucible, and the concentration of carbon in the raw material solution is saturated. Then, at the temperature T2, the crystal growth step of growing a silicon carbide single crystal on the seed crystal is performed. The temperature T1 of the raw material solution 5 in the meltback step is 1420° C. or more and 2100° C. or less, and preferably 1500° C. or more and 2000° C. or less. In addition, the temperature T2 in the crystal growth step is preferably higher than T1 by 5° C. or more, more preferably higher by 50° C. or more, and further preferably higher by 100° C. or more.

Otherwise, when the crucible 3 is not made of graphite, it is also possible to perform the meltback step in a state where the raw material solution 5 is unsaturated by reducing the amount of the carbon source at the time of preparation, and thereafter to perform the crystal growth step by supplying the carbon source to the raw material solution 5 to increase the carbon concentration.

Since the lower surface of the seed crystal 9 is smoothed in the meltback step, the morphology is improved in the subsequent crystal growth step. This is presumably because, when the lower surface of the seed crystal 9 is smoothed, atmospheric gas trapped during immersion in the solvent and bubbles generated from the solvent are likely to escape from the lower surface of the seed crystal 9, suppressing the formation of trenches and improving morphology.

As the crucible 3, a graphite crucible capable of supplying carbon to the raw material solution 5 is preferable. However, a crucible other than a graphite crucible, such as one made of quartz, alumina, titania, hafnia, zirconia, or the like, can be used as long as a hydrocarbon gas or a solid carbon source can be added. Note that the crucible 3 may be rotated for a more uniform temperature distribution of the raw material solution 5.

The raw material solution 5 is heated by a heater 12 provided around the crucible 3 and is kept in a molten state. In the crystal growth step, the temperature T2 of the raw material solution 5 is preferably 1600° C. or more and 2100° C. or less.

As a silicon source of the raw material solution 5, it is possible to use metal silicon, a silicon alloy, a silicon compound, or the like. In addition, as a carbon source of the raw material solution, it is possible to use a solid carbon source such as graphite, glassy carbon, and SiC, and a hydrocarbon gas such as methane, ethane, propane, and acetylene.

The raw material solution 5 is not particularly limited as long as it is a solution containing silicon and carbon used for crystal growth of SiC, but it is preferable to use a solution formed by dissolving carbon in a Si solvent added with an additive element. As the silicon alloy or silicon compound used as the silicon source of the raw material solution, it is possible to use an alloy or compound of silicon with at least one additive element selected from T1, Cr, Sc, Ni, Al, Co, Mn, Ge, As, P, N, B, Dy, Y, Nb, Nd, Fe, V, Cu, Sn, Ga, Cu, and In. In particular, it is preferable to use, as the solvent, a Si—Cr alloy-based solvent containing Cr in an amount of 10 mol % or more and 60 mol % or less from the viewpoints of high carbon solubility, low vapor pressure, and chemical stability. The Cr content of the Si—Cr alloy-based solvent is more preferably 15 mol % or more and 50 mol % or less, and further preferably 20 mol % or more and 40 mol % or less. In addition, by adding Group III elements such as B, Al, Ga, and In, and Group V elements such as N, P, As, and Sb to a Si solvent or an atmospheric gas, the grown crystal can be doped with additive elements, the grown crystal can be changed to p-type or n-type, and the electric characteristics can be controlled. Specifically, when the total concentration of Group III elements (acceptors) contained in SiC is higher than the total concentration of Group V elements (donors), SiC becomes a p-type semiconductor, and when the total concentration of Group V elements is higher than the total concentration of Group III elements, SiC becomes an n-type semiconductor.

In the present production method, it is possible to obtain a grown crystal having good morphology regardless of the presence or absence of doping. This thus makes it possible to reduce the amount of aluminum added, which is known to be effective in stabilizing polymorphism and morphology of the grown crystal. Specifically, the amount of aluminum added to the raw material solution 5 is preferably 3 mol % or less, and more preferably 1 mol % or less relative to the raw material solution. In the present production method, it is not always necessary to add aluminum to the raw material solution.

Figure 3:
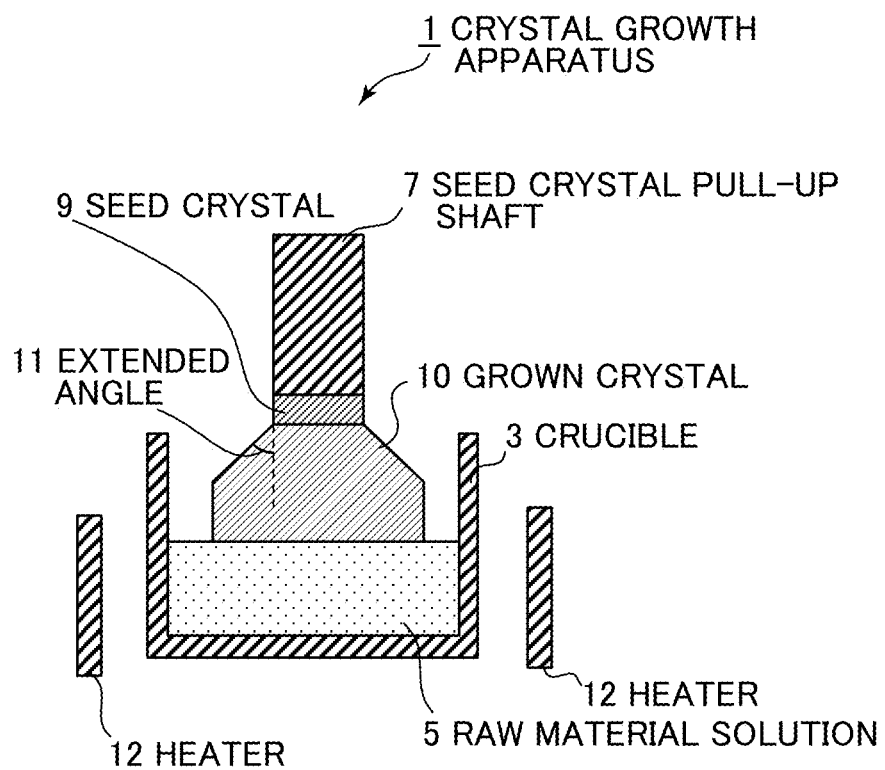
FIG. 3 is a cross sectional view of a crystal growth apparatus 1 during a crystal growth step.

The material of the seed crystal pull-up shaft 7 is not particularly limited, but is formed of a material mainly containing carbon, for example, graphite. The seed crystal 9 is fixed to the tip of the seed crystal pull-up shaft 7 with an adhesive or the like containing carbon. The seed crystal pull-up shaft unit 7 slowly pulls the seed crystal 9 upward during the growth, grows the SiC single crystal, and obtains the grown crystal 10 as illustrated in FIG. 3.

The diameter of the SiC single crystal obtained by growth may be substantially the same as the diameter of the seed crystal 9. Preferably, however, the crystal is grown so that the diameter of the grown-up crystal is larger than that of the seed crystal 9. The angle at which the diameter of the grown-up crystal is enlarged (extended angle 11 in FIG. 3) is preferably 35° to 90°, more preferably 60° to 90°, and further preferably 78° to 90°. If the side face of the seed crystal 9 to be wet with the raw material solution to form a meniscus, the diameter of the grown-up crystal can be made larger than the diameter of the seed crystal 9. Specifically, by lowering the solution temperature around the seed crystal and increasing the degree of carbon supersaturation, it is possible to increase the growth rate in the side face direction of the seed crystal, which can enlarge the crystal diameter.

As the seed crystal 9, 4H—SiC can be used. The lower limit of the thickness of the seed crystal 9 is not particularly limited, but is usually 0.1 mm or more. In addition, the upper limit is set to 10 mm or less because of economical inefficiency in the case of an excessive thickness of the seed crystal 9.

The seed crystal 9 is formed by being cut at an inclination of 60° or more and 68° or less in the <1-100> direction from one of the (0001) surface and the (000-1) surface, and the angle between the cut surface of the seed crystal 9 and one of the (0001) surface and the (000-1) surface is called an off-angle. The off-angle of the seed crystal 9 is preferably 60° or more and 68° or less, more preferably 63° or more and 68° or less, and further preferably 63° or more and 64° or less. The reason is not exactly clear why the angle is preferably 60° or more and 68° or less, but is presumed to be due to a difference in surface atomic structure.

It is preferable to rotate the seed crystal 9 in a plane parallel to the liquid surface of the raw material solution 5 during the crystal growth. The maximum rotation speed of the seed crystal 9 is preferably 10 rpm or more and 300 rpm or less, and more preferably 20 rpm or more and 200 rpm or less. In addition, the rotation of the seed crystal 9 is preferably a rotation periodically repeating forward rotation and reverse rotation, and the period is preferably 10 seconds or more and 5 minutes or less, more preferably 15 seconds or more and 3 minutes or less, and further preferably 30 seconds or more and 2 minutes 30 seconds or less. By periodically switching the rotation direction, it is possible to control the flow of the raw material solution on the growth surface of the seed crystal during crystal growth.

In the meltback step and the crystal growth step, the seed crystal growth apparatus 1 is preferably in an atmosphere of an inert gas such as helium or argon. In addition, in order to obtain a grown crystal of an n-type semiconductor, nitrogen may be contained in an amount of 0.01% by volume or more and 3.0% by volume or less.

In the crystal growth step, at least the raw material solution 5 in contact with the crystal growth surface of the seed crystal 9 needs to be in a supersaturated state. A possible method for obtaining a supersaturated state of SiC is an evaporation method including evaporating the solution to a supersaturated state, a cooling method including immersing the seed crystal substrate in a SiC solution having a saturated concentration and then performing supercooling to a supersaturated state, a temperature difference method including immersing the seed crystal substrate in a SiC solution having a temperature gradient and then crystallizing a SiC crystal in a low temperature portion, and the like.

When the temperature difference method is used, only the vicinity of the seed crystal 9 is supersaturated after controlling the heating of the raw material solution 5 or cooling the raw material solution 5 with the seed crystal 9. Thus, the seed crystal pull-up shaft 7 rotates and pulls the seed crystal 9 at a position in contact with the liquid surface of the raw material solution 5, so that a SiC crystal is precipitated on the crystal growth surface of the seed crystal 9.

When the cooling method or the evaporation method is used, the entire raw material solution 5 becomes supersaturated. Thus, it is possible to grow a crystal while immersing the seed crystal 9 in the raw material solution 5.

Figure 4:
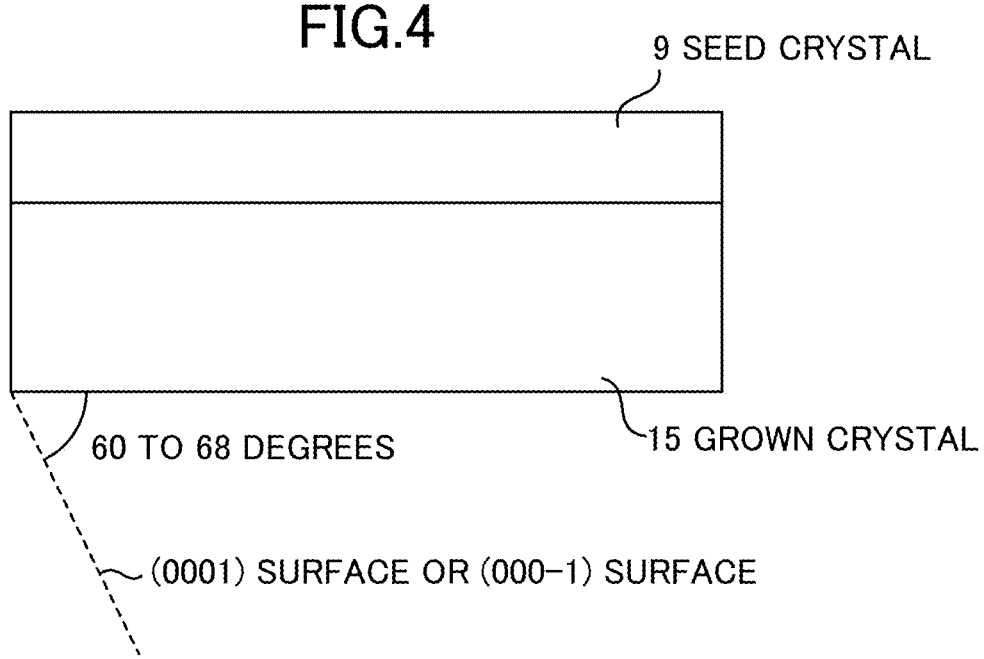
FIG. 4 is a schematic view of a cross section of a grown crystal 15 having an off-angle.

As illustrated in FIG. 4, in the crystal growth step, carbon and silicon are precipitated from the raw material solution 5 on the lower surface (growth surface) of the seed crystal 9 to form a grown crystal 15 made of 4H—SiC. In the embodiment illustrated in FIG. 4, the diameter of the grown crystal 15 is substantially the same as the diameter of the seed crystal 9. The off-angle of the lower surface (front surface) of the grown crystal 15 coincides with the off-angle of the lower surface (growth surface) of the seed crystal 9, and is a surface which is inclined at 60° or more and 68° or less, preferably 63° or more and 68° or less, and more preferably 63° or more and 64° or less in the <1-100> direction from one of the (0001) surface and the (000-1) surface.

The thickness of the grown crystal 15 depends on the growth rate and the time of the crystal growth step, but is preferably 100 µm or more, preferably 1 mm or more, and more preferably 50 mm or more. If the grown crystal 15 is thick, it is possible to obtain a large number of SiC substrates in a single crystal growth.

The time of the crystal growth step depends on the thickness and growth rate required for the grown crystal 15, but is usually 1 hour or more, and may be 4 hours or more.

The grown crystal 15 is separated from the seed crystal pull-up shaft 7 into a SiC single crystal ingot. The seed crystal 9 is usually cut from a SiC single crystal ingot. The crystal growth direction of the SiC single crystal ingot coincides with the major axis direction of the SiC single crystal ingot. Note that the SiC single crystal ingot usually has a circular cross section, or may otherwise be a polygonal column having a polygonal cross section such as a hexagon.

A 4H type silicon carbide single crystal wafer can be obtained by cutting the SiC single crystal ingot into a thin plate such that the cut surface is a surface inclined at 60° or more and 68° or less, preferably 63° or more and 68° or less, and more preferably 63° or more and 64° or less in the <1-100> direction from one of the (0001) surface and the (000-1) surface. The cut surface may be parallel to or oblique to the growth surface of the grown crystal 15.

That is, the front surface of the 4H type silicon carbide single crystal wafer (cut surface of the ingot) according to the embodiment of the present invention is a surface inclined at 60° or more and 68° or less, preferably 63° or more and 68° or less, and more preferably 63° or more and 64° or less in the <1-100> direction from one of the (0001) surface and the (000-1) surface. In addition, the thickness of the wafer is preferably 100 µm or more, and more preferably 200 µm or more. The diameter of the wafer is preferably 10 mm or more, more preferably 50 mm or more, and further preferably 100 mm or more.

In addition, the concentration of aluminum contained in the SiC single crystal ingot or wafer is preferably $1 \times 10^{19}$ counts/cm$^3$ or less, and preferably $5 \times 10^{18}$ counts/cm$^3$ or less. Note that, if aluminum is not added to the raw material solution, the concentration of aluminum inevitably mixed in from the raw material is $1 \times 10^{17}$ counts/cm$^3$ or less. Note that the aluminum concentration in the SiC single crystal is $1 \times 10^{12}$ counts/cm$^3$ or more due to limitations of the purification technique and other reasons.

In addition, when aluminum is added as a dopant for obtaining a p-type semiconductor, the concentration of aluminum in the SiC single crystal is preferably $1 \times 10^{17}$ counts/cm$^3$ or more, and more preferably $5 \times 10^{17}$ counts/cm$^3$ or more. Note that the concentration of elements such as aluminum and nitrogen contained in the SiC single crystal can be measured with a secondary ion mass spectrometer or the like.

Examples of the 4H type silicon carbide single crystal according to the embodiment of the present invention include a p-type semiconductor in which the concentration of an acceptor such as Al is $1 \times 10^{17}$ counts/cm$^3$ or more and $1 \times 10^{19}$ counts/cm$^3$ or less, and an n-type semiconductor in which the concentration of a donor such as N is $1 \times 10^{17}$ counts/cm$^3$ or more and the concentration of the donor is higher than the concentration of the acceptor. Another example is high-purity semi-insulating silicon carbide in which the total concentration of donors (such as B, Al, Ga, and In) and the total concentration of acceptors (such as N, P, As, and Sb) are both $1 \times 10^{17}$ counts/cm$^3$ or less.

The production method of the present invention makes it possible to obtain a grown crystal having good morphology regardless of the presence or absence of doping.

The SiC single crystal obtained by the production method of the present invention contains 4H—SiC only, and has a smaller resistance value than that of a crystal obtained by co-doping. Therefore, the wafer cut out therefrom is suitable as a material for electronic devices, in particular as a substrate material for power devices.

EXAMPLES

Example 1

From a 4H—SiC single crystal ingot, a surface inclined at 63° in the [1-100] direction relative to the (000-1) surface was cut out to a length of 10 mm, a width of 10 mm, and a thickness of 1 mm to obtain a seed crystal. The cutout surface as the lower end was fixed to a carbon pulling shaft, and held above the resistance heating furnace. In a graphite crucible installed in the center of the furnace, a mixed melt of silicon and chromium (chromium in an amount of 20 mol %) was prepared, and the temperature was raised. The atmospheric gas was helium, and 0.4% by volume of nitrogen was added. In order to smooth the growth surface, the seed crystal was brought into contact with the melt when the melt reached 1764° C. in the course of raising the temperature to dissolve the projected portions on the lower surface of the seed crystal. Thereafter, when the in-furnace temperature was stabilized at the target temperature of 1920° C., crystal growth proceeded from the lower end of the seed crystal. During the growth, the pulling shaft was rotated at 30 rpm in the forward and reverse directions at a period of 30 seconds. After 5 hours, the seed crystal was pulled out of the melt, and the inside of the furnace was cooled.

Figure 5:
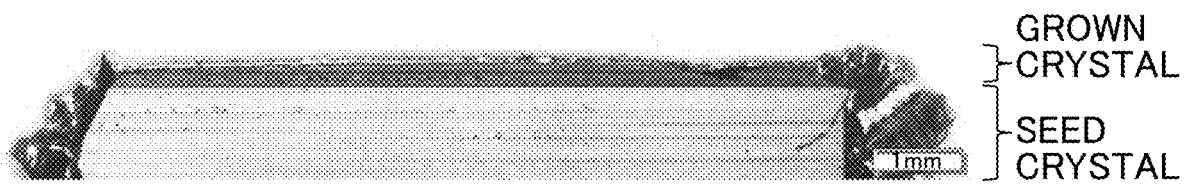
FIG. 5 is a micrograph of a cross section of a seed crystal and a grown crystal according to Example 1.

The seed crystal was cut off from the pulling axis, and then was sliced perpendicularly to the [11-20] direction using a wire saw. The cut surface was mirror-polished, and then was analyzed using a Raman microscope and an optical microscope. FIG. 5 is an optical microscope image of a cross section of the crystal obtained in Example 1. The lower white region is the seed crystal, and the darker region thereon is the growth layer (grown crystal). The thickness of the growth layer was about 300 µm. It was confirmed from the Raman scattering spectrum measurement that the entire growth layer was a 4H type SiC single crystal. In addition, there were almost no trenches and no solvent inclusion in the growth layer, suggesting that a growth layer (grown crystal) of the SiC single crystal having good morphology was obtained.

Examples 2 to 7

In Examples 2 to 7, crystals were grown in the same manner as in Example 1 except that 4H—SiC single crystal

[Heterogeneous Polymorph Evaluation]

The presence or absence of heterogeneous polymorphs among the grown crystals was observed by Raman scattering spectrum measurement.

○: The growth layer does not contain any polymorphs other than 4H.

X: The growth layer contains a polymorph other than 4H.

TABLE 1

|  | Angle of Seed Crystal | Temperature of Melt When in Contact with Seed Crystal | Temperature of Melt during Crystal Growth | Evaluation of Morphology | Evaluation of Heterogeneous Polymorph |
|---|---|---|---|---|---|
| Example 1 | 63° | 1764° C. | 1920° C. | ◉ | ○ |
| Example 2 | 60° | 1764° C. | 1920° C. | ○ | ○ |
| Example 3 | 61° | 1764° C. | 1920° C. | ○ | ○ |
| Example 4 | 62° | 1764° C. | 1920° C. | ○ | ○ |
| Example 5 | 64° | 1764° C. | 1920° C. | ◉ | ○ |
| Example 6 | 65° | 1764° C. | 1920° C. | ○ | ○ |
| Example 7 | 68° | 1764° C. | 1920° C. | ○ | ○ |
| Comparative Example 1 | 62° | 1920° C. | 1920° C. | Δ | ○ |
| Comparative Example 2 | 63° | 1920° C. | 1920° C. | Δ | ○ |
| Comparative Example 3 | 0° | 1764° C. | 1920° C. | ○ | X |
| Comparative Example 4 | 0° | 1920° C. | 1920° C. | ○ | X | ingots were used to cut out surfaces inclined at 60°, 61°, 62°, 64°, 65°, and 68°, respectively, in the [1-100] direction from the (000-1) surface.

Comparative Examples 1 and 2

Crystals were grown in the same manner as in Example 1 except that 4H—SiC single crystal ingots were used to cut out surfaces inclined at 62° and 63° in the [1-100] direction from the (000-1) surface and further that the seed crystal was brought into contact with the melt after stabilization of the melt at 1920° C.

Comparative Example 3

A crystal was grown in the same manner as in Example 1 except that a 4H—SiC single crystal ingot was used to cut out a surface inclined at 0° in the [1-100] direction from the (000-1) surface (that is, the (000-1) surface).

Comparative Example 4

A crystal was grown in the same manner as in Comparative Example 3 except that the seed crystal was brought into contact with the melt after the melt reached 1920° C.

[Morphology Evaluation]

The area of the region without trenches in the grown crystal was observed with a microscope.

◉: The region without trenches accounts for 90% or more and 100% or less of the area of the growth layer.

○: The region without trenches accounts for 30% or more and less than 90% of the area of the growth layer.

Δ: The region without trenches accounts for 0% or more and less than 30% of the area of the growth layer.

In Examples 1 to 7 in which the angle of inclination of the seed crystal was 60° or more and 68° or less and the melt back step was performed by bringing the seed crystal into contact with the melt in a state of unsaturated carbon concentration in the course of raising the temperature, no heterogeneous polymorph was formed and a region without trenches was obtained even in the case of doping with nitrogen alone. In particular, in Examples 1 and 4 in which the angles of inclination were 63° and 64°, growth layers having particularly good morphology were obtained.

FIG. 5 illustrates a micrograph of a cross section of the growth layer (grown crystal) obtained in Example 1. The grown crystal obtained in Example 1 had a region without trenches on the entire surface, and had good morphology.

On the other hand, in Comparative Examples 1 and 2 in which the seed crystal was brought into contact with a melt having a saturated carbon concentration in a stable state at the target temperature, that is, the meltback step was not performed, trenches were formed on the entire surface of the growth layer, and the morphology was poor. The reason is presumably as follows. Since the meltback step was not performed, the atmospheric gas trapped on the lower surface of the seed crystal during the immersion in the solvent and the gas generated from the solvent remained on the rough lower surface of the seed crystal 9 as bubbles. For this reason, bubbles were taken into the grown crystal or the crystal growth rate of the bubble portions was reduced, so that trenches were formed, resulting in poor morphology.

In Comparative Examples 3 and 4, a region without trenches was obtained when the angle of inclination was 0°, that is, when cutting was performed on the (000-1) surface. However, heterogeneous polymorphs of 6H—SiC and 15R—SiC were observed. In Comparative Example 3 with the meltback step and Comparative Example 4 without the meltback step, there was no difference in the frequency of production of trenches, and no influence on the morphology of the meltback step was observed.

Note that, in Examples and Comparative Examples, an n-type semiconductor 4H—SiC was obtained in which the concentration of nitrogen atoms was higher than the concentration of aluminum atoms. The reason is presumably as follows. Since nitrogen gas was added to the atmospheric gas, the concentration of nitrogen atoms in the obtained grown crystal was naturally $1\times10^{17}$ counts/cm$^3$ or more, and since aluminum was not added to the raw material solution, the concentration of aluminum in the obtained grown crystal was naturally $1\times10^{17}$ counts/cm$^3$ or less.

In Examples and Comparative Examples, aluminum was not added to the raw material solution. However, it is known that aluminum, when added to a raw material solution, is effective in stabilizing polymorphism and morphology of a grown crystal. For this reason, even when aluminum is added to the raw material solution, the effects of polymorph stabilization and morphology stabilization according to the present invention are considered to be exhibited in the same manner as in Examples and Comparative Examples.

In addition, in Examples and Comparative Examples, nitrogen gas was added to the atmospheric gas. However, it is known from Non Patent Literature 2 and the like that nitrogen atoms destabilize the polymorph of a grown crystal of 4H—SiC. For this reason, even when the atmospheric gas does not contain nitrogen gas, the effect of polymorph stabilization according to the present invention is considered to be exhibited in the same manner as in Examples and Comparative Examples. Therefore, it is considered that, even when the atmospheric gas does not contain nitrogen gas, the present invention makes it possible to obtain a 4H—SiC single crystal having good morphology while preventing heterogeneous polymorphs from being mixed in.

REFERENCE SIGNS LIST 1 crystal growth apparatus
3 crucible
5 raw material solution
7 seed crystal pull-up shaft
9 seed crystal
10 grown crystal
11 extended angle
12 heater
15 grown crystal

What is claimed is:

1. A 4H type silicon carbide single crystal wafer, wherein
a front surface is a surface inclined at 60° or more and 68° or less in a <1-100>direction from one of a (0001) surface and a (000-1) surface, and
a concentration of aluminum atoms is $1\times10^{19}$ counts/cm$^3$ or less.

2. The 4H type silicon carbide single crystal wafer according to claim 1, wherein the front surface is a surface inclined at 63° or more and 68° or less in the <1-100>direction from one of the (0001) surface and the (000-1) surface.

3. The 4H type silicon carbide single crystal wafer according to claim 1, wherein
the concentration of aluminum atoms in the 4H type silicon carbide single crystal wafer is $1\times10^{17}$ counts/cm$^3$ or more, and
the 4H type silicon carbide single crystal wafer is a p-type semiconductor.

4. The 4H type silicon carbide single crystal wafer according to claim 1, wherein
a concentration of nitrogen atoms in the 4H type silicon carbide single crystal wafer is $1\times10^{17}$ counts/cm$^3$ or more, and
the 4H type silicon carbide single crystal wafer is an n-type semiconductor.

5. The 4H type silicon carbide single crystal wafer according to claim 1, wherein
a total concentration of B, Al, Ga, and In in the 4H type silicon carbide single crystal wafer is $1\times10^{17}$ counts/cm$^3$ or less, and
a total concentration of N, P, As, and Sb in the 4H type silicon carbide single crystal wafer is $1\times10^{17}$ counts/cm$^3$ or less.

6. The 4H type silicon carbide single crystal wafer according to claim 1, wherein a thickness of the wafer is 100 μm or more.

7. A 4H type silicon carbide single crystal comprising:
a 4H type silicon carbide grown crystal on a 4H type silicon carbide seed crystal, wherein
a front surface of the grown crystal is a surface inclined at 60° or more and 68° or less in a <1-100>direction from one of a (0001) surface and a (000-1) surface, and
a concentration of aluminum atoms in the grown crystal is $1\times10^{19}$ counts/cm$^3$ or less.

8. The 4H type silicon carbide single crystal according to claim 7, wherein a thickness of the grown crystal is 100 μm or more.

* * * * *